(12) United States Patent
Cheng et al.

(10) Patent No.: US 12,150,243 B2
(45) Date of Patent: Nov. 19, 2024

(54) PACKAGE ASSEMBLY (71) Applicant: Wiwynn Corporation, New Taipei (TW)

(72) Inventors: Yi Cheng, New Taipei (TW);
Wei-Ching Chang, New Taipei (TW);
Kang-Bin Mah, New Taipei (TW);
Li-Wei Chen, New Taipei (TW);
Zi-Ping Wu, New Taipei (TW);
Ting-Yu Pai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 226 days.

(21) Appl. No.: 17/990,748

(22) Filed: Nov. 21, 2022

(65) Prior Publication Data

US 2023/0189434 A1 Jun. 15, 2023

Related U.S. Application Data

(60) Provisional application No. 63/356,041, filed on Jun. 28, 2022, provisional application No. 63/287,528, filed on Dec. 9, 2021.

(51) Int. Cl.
*H05K 7/20* (2006.01)
*H05K 1/02* (2006.01)
(Continued)

(52) U.S. Cl.
CPC ........... *H05K 1/0272* (2013.01); *H05K 1/115* (2013.01); *H05K 1/181* (2013.01); *H05K 2201/064* (2013.01); *H05K 2201/10977* (2013.01)

(58) Field of Classification Search
CPC .............. H01L 23/473; H01L 21/4882; H01L 23/3675; G06F 1/20; G06F 2200/201; H05K 7/20254; H05K 7/203; H05K 7/20272; H05K 7/20309; H05K 7/20509; H05K 7/20318; H05K 1/0203; H05K 7/20409; H05K 7/20236; H05K 7/20327; H05K 7/20281
(Continued)

(56) References Cited

U.S. PATENT DOCUMENTS 6,351,384 B1 * 2/2002 Daikoku .................. F28F 13/12
361/689
6,665,187 B1 * 12/2003 Alcoe ...................... H01L 23/10
257/E23.101
(Continued)

FOREIGN PATENT DOCUMENTS

| CN | 110828399 A | 2/2020 |
|---|---|---|
| TW | 200819962 | 5/2008 |
| WO | 2020/106323 A1 | 5/2020 |

*Primary Examiner* — Mandeep S Buttar
(74) *Attorney, Agent, or Firm* — Winston Hsu (57) ABSTRACT

A package assembly includes a substrate, an electronic component and a cover. The electronic component and the cover are disposed on the substrate, wherein the electronic component is located within a chamber between the cover and the substrate. A cooling liquid may be filled in a heat dissipation space of the cover, so as to dissipate the heat generated by the electronic component. Furthermore, the cooling liquid may be filled in the chamber where the electronic component is located, so as to directly dissipate the heat generated by the electronic component.

12 Claims, 8 Drawing Sheets

(51) Int. Cl.
*H05K 1/11* (2006.01)
*H05K 1/18* (2006.01)

(58) Field of Classification Search
USPC .............. 361/699, 700, 689, 702, 703, 704,
361/679.53, 679.54, 688, 701;
165/104.33, 80.4
See application file for complete search history.

(56) References Cited

U.S. PATENT DOCUMENTS

| | | | |
|---|---|---|---|
| 8,014,150 B2* | 9/2011 | Campbell | H05K 7/20809 |
| | | | 165/185 |
| 9,357,675 B2* | 5/2016 | Campbell | B23P 15/26 |
| 10,553,522 B1* | 2/2020 | Canaperi | F28F 21/089 |
| 10,622,283 B2* | 4/2020 | Leobandung | H01L 23/433 |
| 2018/0090417 A1* | 3/2018 | Gutala | H01L 21/4882 |
| 2019/0385925 A1 | 12/2019 | Walczyk | |
| 2020/0296862 A1* | 9/2020 | Iyengar | H05K 3/30 |
| 2022/0230937 A1* | 7/2022 | Malouin | H01L 23/473 |

* cited by examiner

PACKAGE ASSEMBLY

CROSS REFERENCE TO RELATED APPLICATIONS

This application claims the benefit of U.S. Provisional Application No. 63/356,041, filed on Jun. 28, 2022. Further, this application claims the benefit of U.S. Provisional Application No. 63/287,528, filed on Dec. 9, 2021. The contents of these applications are incorporated herein by reference.

BACKGROUND OF THE INVENTION

1. Field of the Invention

The disclosure relates to a package assembly and, more particularly, to a package assembly capable of effectively improving heat dissipating efficiency.

2. Description of the Prior Art

Heat dissipation is a significant issue for electronic components. When an electronic component is operating, the current in circuit will generate unnecessary heat due to impedance. If the heat is accumulated in the electronic component without dissipating immediately, the electronic component may get damage and/or the performance thereof may get worse due to the accumulated heat. Therefore, how to effectively improve heat dissipating efficiency has become a significant design issue.

SUMMARY OF THE INVENTION

According to an embodiment of the disclosure, a package assembly comprises a substrate, an electronic component, a cover, a first tube and a second tube. The electronic component is disposed on the substrate. The cover is disposed on the substrate. The cover comprises a top portion, a first side portion, a second side portion and a heat dissipation space. The first side portion and the second side portion extend from opposite sides of the top portion and are connected to the substrate. The heat dissipation space is formed within the top portion, the first side portion and the second side portion. A chamber is formed between the top portion, the first side portion, the second side portion and the substrate. The electronic component is located within the chamber. The first tube is connected to the first side portion and communicates with the heat dissipation space. The second tube is connected to the second side portion and communicates with the heat dissipation space.

According to another embodiment of the disclosure, a package assembly comprises a substrate, an electronic component, a cover, a first tube, a second tube and a first thermal interface material. The electronic component is disposed on the substrate. The cover is disposed on the substrate. The cover comprises a top portion, a first side portion and a second side portion. The first side portion and the second side portion extend from opposite sides of the top portion and are connected to the substrate. A chamber is formed between the top portion, the first side portion, the second side portion and the substrate. The electronic component is located within the chamber. The first tube is connected to the first side portion and communicates with the chamber. The second tube is connected to the second side portion and communicates with the chamber. The first thermal interface material is disposed in the chamber and sandwiched in between the electronic component and the top portion.

These and other objectives of the present invention will no doubt become obvious to those of ordinary skill in the art after reading the following detailed description of the preferred embodiment that is illustrated in the various figures and drawings.

DETAILED DESCRIPTION

An XYZ coordinate system shown in the following figures is used to define a cross-sectional orientation of each package assembly.

Figure 1:
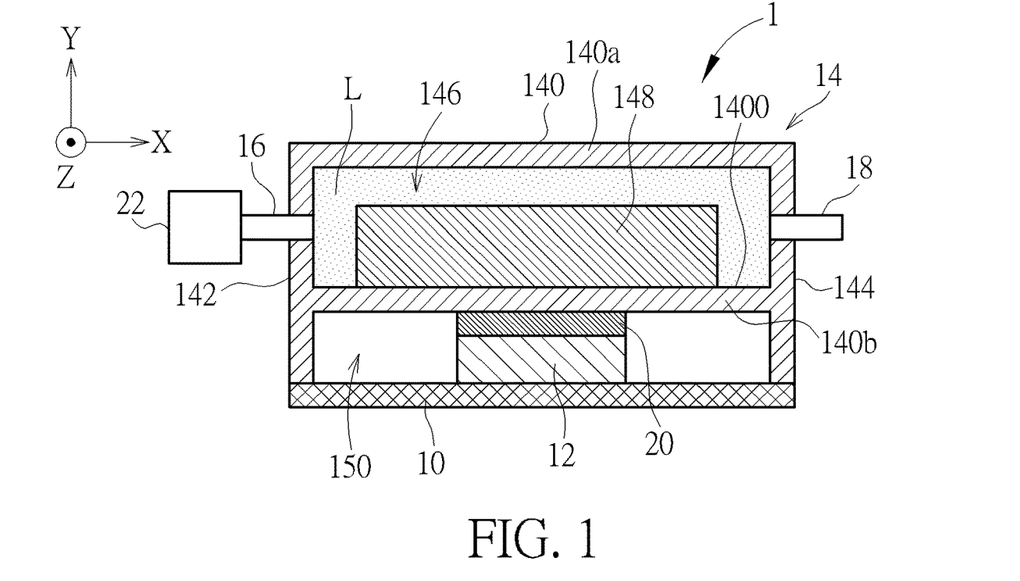
FIG. 1 is a cross-sectional view illustrating a package assembly according to an embodiment of the disclosure.
Figure 2:
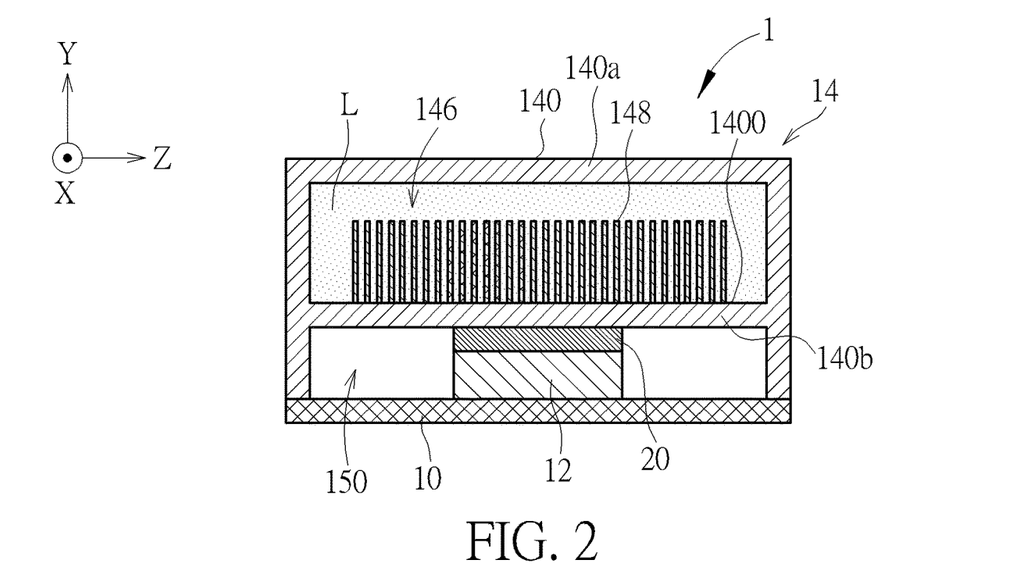
FIG. 2 is another cross-sectional view illustrating the package assembly shown in FIG. 1.

Referring to FIGS. 1 and 2, FIG. 1 is a cross-sectional view illustrating a package assembly 1 according to an embodiment of the disclosure and FIG. 2 is another cross-sectional view illustrating the package assembly 1 shown in FIG. 1.

As shown in FIGS. 1 and 2, the package assembly 1 comprises a substrate 10, an electronic component 12, a cover 14, a first tube 16, a second tube 18 and a thermal interface material (TIM) 20. In this embodiment, the substrate 10 maybe a printed circuit board (PCB) or the like, the electronic component 12 may be a die, chipset or the like, and the thermal interface material 20 may be thermal paste or the like. In some embodiments, a portion of a top surface of the electronic component 12 may be covered by the thermal interface material 20. For example, the TIM 20 illustrated in FIGS. 1 and 2 covers total area of the top surface of the electronic component 12.

The electronic component 12 and the cover 14 are disposed on the substrate 10, wherein the electronic component 12 is located within the cover 14. In this embodiment, the cover 14 comprises a top portion 140, a first side portion 142, a second side portion 144 and a heat dissipation space 146. The first side portion 142 and the second side portion 144 extend from opposite sides of the top portion 140 and are connected to the substrate 10. In an embodiment, the cover 14 may comprise a plurality of side portions surrounding the top portion 140, the plurality of side portions may be connected to the substrate 10 by a sealant, an adhesive or the like, and the first side portion 142 and the second side portion 144 may be two opposite side portions of the plurality of side portions. In this embodiment, the cover 14 may further comprise a plurality of fins 148 disposed in the heat dissipation space 146, extending from an inner surface 1400 of the top portion 140, and spaced apart from each other. In the illustrated embodiment shown in FIG. 2, the fins 148 are arranged in parallel to each other. After the electronic component 12 and the cover 14 are disposed on the substrate 10, a chamber 150 is formed between the top portion 140, the first side portion 142, the second side portion 144 and the substrate 10, and the electronic component 12 is located within the chamber 150.

The heat dissipation space 146 is formed within the top portion 140, the first side portion 142 and the second side portion 144. In the illustrated embodiment, the top portion 140 may comprise two plates 140a, 140b arranged between the first side portion 142 and the second side portion 144. The heat dissipation space 146 may be defined by the two plates 140a, 140b, the first side portion 142 and the second side portion 144. As shown in FIG. 1, the first tube 16 is connected to the first side portion 142 and the second tube 18 is connected to the second side portion 144, wherein the first tube 16 and the second tube 18 both fluidly communicate with the heat dissipation space 146. Furthermore, the thermal interface material 20 is disposed in the chamber 150 and sandwiched in between the electronic component 12 and the top portion 140.

In this embodiment, the package assembly 1 may further comprise a pump 22 connected to the first tube 16. The pump 22 may drive a cooling liquid L to flow into the heat dissipation space 146 through the first tube 16, wherein a flowing direction of the cooling liquid L is parallel to a length direction of each fin 148 within the heat dissipation space 146. When the electronic component 12 is operating, the heat generated by the electronic component 12 is conducted to the top portion 140 and the fins 148 through the thermal interface material 20. The heat is transferred to the cooling liquid L in the heat dissipation space 146 and then the cooling liquid L flows out of the heat dissipation space 146 through the second tube 18. Accordingly, the heat generated by the electronic component 12 can be effectively dissipated by the cooling liquid L. In an embodiment, the cooling liquid L may be glycol, dielectric liquid, water, alcohol, a combination of water and alcohol, a combination of water and glycol, or other coolants. In an embodiment, the second tube 18 may be further connected to a radiator, a tank, and/or other liquid cooling components according to practical applications.

Through simulation analysis, the thermal resistance of the package assembly 1 shown in FIGS. 1 and 2 from a junction between the electronic component 12 and the substrate 10 to the cover 14 may be reduced to about 0.0377° C/W. Accordingly, the heat dissipating efficiency of the package assembly 1 can be effectively improved.

Figure 3:
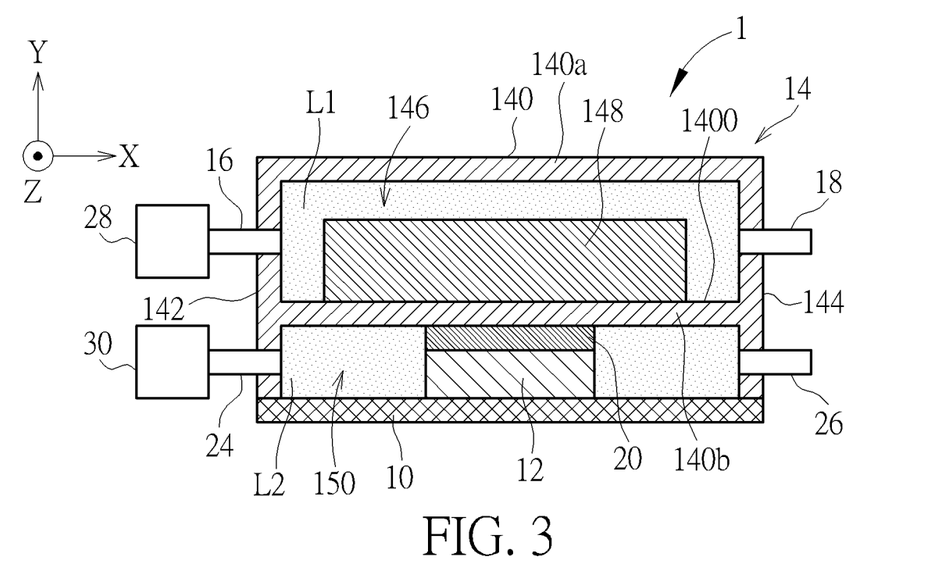
FIG. 3 is a cross-sectional view illustrating a package assembly according to another embodiment of the disclosure.

Referring to FIG. 3, FIG. 3 is a cross-sectional view illustrating a package assembly 1 according to another embodiment of the disclosure.

As shown in FIG. 3, the package assembly 1 may further comprise a third tube 24 and a fourth tube 26. The third tube 24 is connected to the first side portion 142 and the fourth tube 26 is connected to the second side portion 144, wherein the third tube 24 and the fourth tube 26 both fluidly communicate with the chamber 150. In this embodiment, the package assembly 1 may further comprise a first pump 28 and a second pump 30, wherein the first pump 28 may be connected to the first tube 16 and the second pump 30 may be connected to the third tube 24. The first pump 28 may drive a first cooling liquid L1 to flow into the heat dissipation space 146 through the first tube 16. When the electronic component 12 is operating, the heat generated by the electronic component 12 is conducted to the top portion 140 and the fins 148 through the thermal interface material 20. The heat is transferred to the first cooling liquid L1 in the heat dissipation space 146 and then the first cooling liquid L1 flows out of the heat dissipation space 146 through the second tube 18. Furthermore, the second pump 30 may drive a second cooling liquid L2 to flow into the chamber 150 through the third tube 24. The heat generated by the electronic component 12 is directly transferred to the second cooling liquid L2 in the chamber 150 and then the second cooling liquid L2 flows out of the chamber 150 through the fourth tube 26. Accordingly, the heat generated by the electronic component 12 can be effectively dissipated by the first cooling liquid L1 and the second cooling liquid L2. In an embodiment, the first cooling liquid L1 maybe glycol, dielectric liquid, water, alcohol, a combination of water and alcohol, a combination of water and glycol, or other coolants, and the second cooling liquid L2 may be dielectric liquid or the like. It should be noted that the first cooling liquid L1 and the second cooling liquid L2 may be the same cooling liquid or different cooling liquids according to practical applications. In an embodiment, the second tube 18 and the fourth tube 26 may be further connected to a radiator, a tank, and/or other liquid cooling components according to practical applications.

In practical applications, the size of the chamber 150 is usually smaller than the size of the heat dissipation space 146, such that the fluid pressures in the chamber 150 and the heat dissipation space 146 are different. Therefore, the disclosure may use the first pump 28 and the second pump 30 to respectively drive the first cooling liquid L1 and the second cooling liquid L2 with different output powers, so as to satisfy the fluid pressures in the chamber 150 and the heat dissipation space 146. For example, the first pump 28 may drive the first cooling liquid L1 with a relative small output power while the second pump 30 may drive the second cooling liquid L2 with a relative large output power.

Through simulation analysis, the thermal resistance of the package assembly 1 shown in FIG. 3 from a junction between the electronic component 12 and the substrate 10 to the cover 14 may be reduced to about 0.0345° C/W. Accordingly, the heat dissipating efficiency of the package assembly 1 can be further improved.

Figure 4:
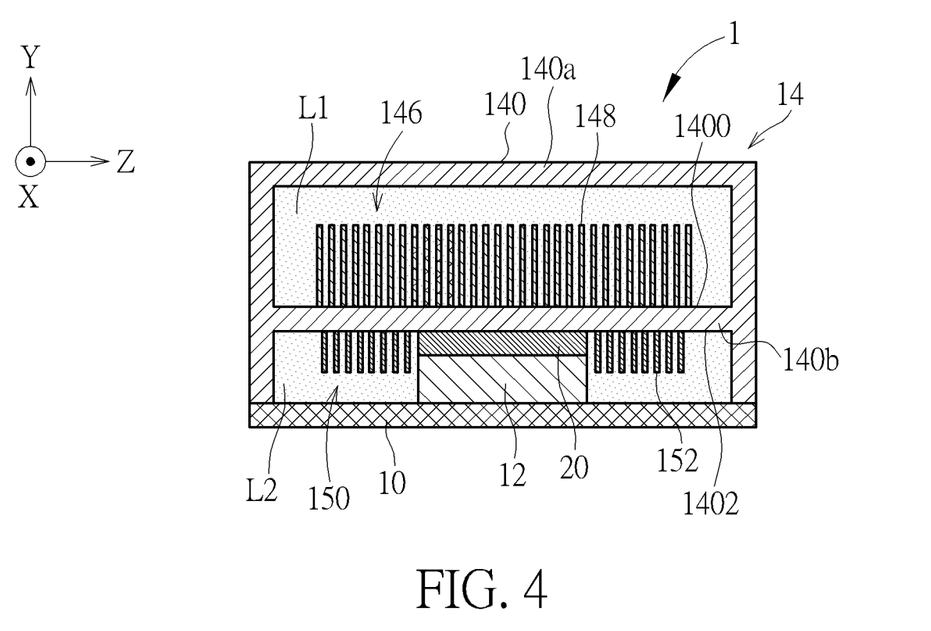
FIG. 4 is a cross-sectional view illustrating a package assembly according to another embodiment of the disclosure.

Referring to FIG. 4, FIG. 4 is a cross-sectional view illustrating a package assembly 1 according to another embodiment of the disclosure.

As shown in FIG. 4, the cover 14 may further comprise a plurality of fins 152 disposed in the chamber 150, extending from a lower surface 1402 of the top portion 140 facing the electronic component 12, and spaced apart from each other. In the illustrated embodiments, fins 152 are arranged in parallel to each other, wherein a flowing direction of the second cooling liquid L2 is parallel to a length direction of each fin 152 within the chamber 150. The fins 152 disposed in the chamber 150 may be arranged close to at least one side of the electronic component 12. For instance, in this embodiment, the fins 152 may be arranged at opposite sides of the electronic component 12, but the disclosure is not so limited.

Through simulation analysis, the thermal resistance of the package assembly 1 shown in FIG. 4 from a junction between the electronic component 12 and the substrate 10 to the cover 14 may be reduced to about 0.0335° C/W. Accordingly, the heat dissipating efficiency of the package assembly 1 can be further improved.

Figure 5:
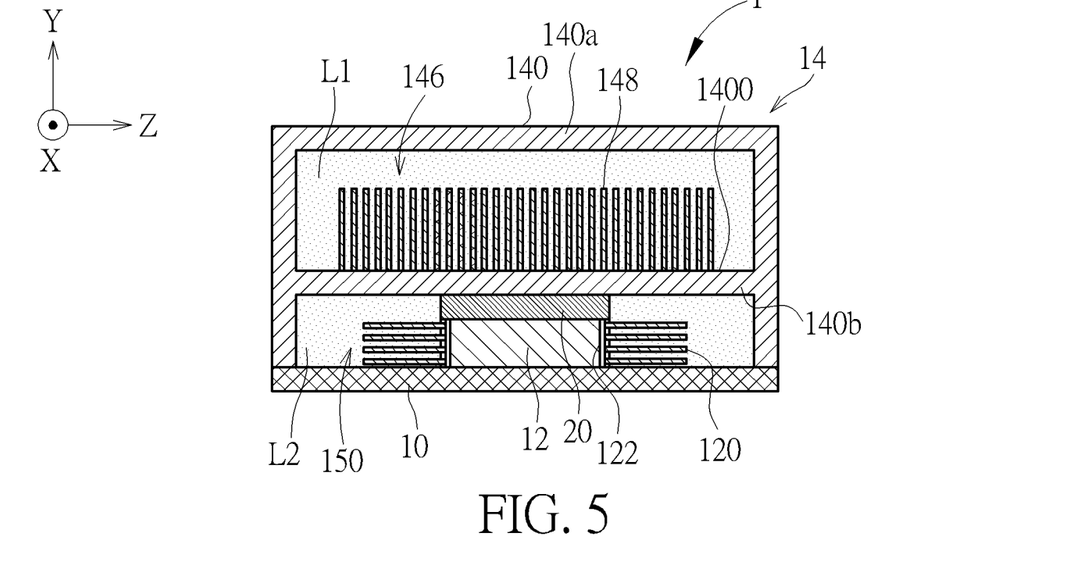
FIG. 5 is a cross-sectional view illustrating a package assembly according to another embodiment of the disclosure.

Referring to FIG. 5, FIG. 5 is a cross-sectional view illustrating a package assembly 1 according to another embodiment of the disclosure.

As shown in FIG. 5, the electronic component 12 may comprise a plurality of fins 120 extending from a periphery of the electronic component 12 and spaced apart from each other. In some embodiments, the electronic component 12 may be a die. In the illustrated embodiment, the fins 120 are arranged in parallel to each other, wherein a flowing direction of the second cooling liquid L2 is parallel to a length direction of each fin 120 within the chamber 150. The fins 120 may extend from at least one side of the electronic component 12. For example, in this embodiment, the fins 120 may extend from opposite sides of the electronic component 12, but the disclosure is not so limited. In this embodiment, the electronic component 12 may further be formed with at least one via 122 and the plurality of fins 120 may extend from the at least one via 122. In an embodiment, the via 122 may be a through silicon via (TSV) or the like.

Through simulation analysis, the thermal resistance of the package assembly 1 shown in FIG. 5 from a junction between the electronic component 12 and the substrate 10 to the cover 14 may be reduced to about 0.033° C/W. Accordingly, the heat dissipating efficiency of the package assembly 1 can be further improved.

Figure 6:
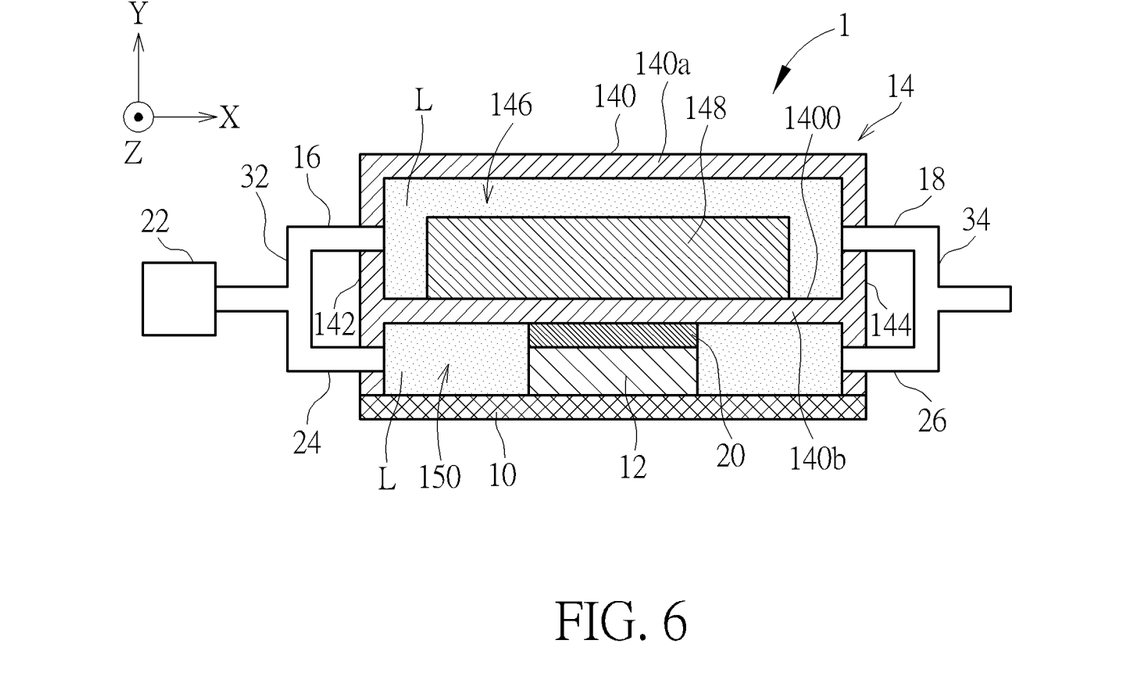
FIG. 6 is a cross-sectional view illustrating a package assembly according to another embodiment of the disclosure.

Referring to FIG. 6, FIG. 6 is a cross-sectional view illustrating a package assembly 1 according to another embodiment of the disclosure.

As shown in FIG. 6, the package assembly 1 may further comprise a first manifold 32 and a second manifold 34, wherein the first manifold 32 is connected to the first tube 16 and the third tube 24, and the second manifold 34 is connected to the second tube 18 and the fourth tube 26. Furthermore, the pump 22 may be connected to the first manifold 32. The pump 22 may drive a cooling liquid L to flow into the heat dissipation space 146 and the chamber 150 at the same time through the first manifold 32, the first tube 16 and the third tube 24. Then, the cooling liquid L will flow out of the heat dissipation space 146 and the chamber 150 through the second tube 18, the fourth tube 26 and the second manifold 34. Thus, the first pump 28 and the second pump 30 shown in FIG. 3 may be replaced by the pump 22 shown in FIG. 6 to reduce the manufacturing cost of the package assembly 1. In an embodiment, the cooling liquid L may be dielectric liquid or the like.

Figure 7:
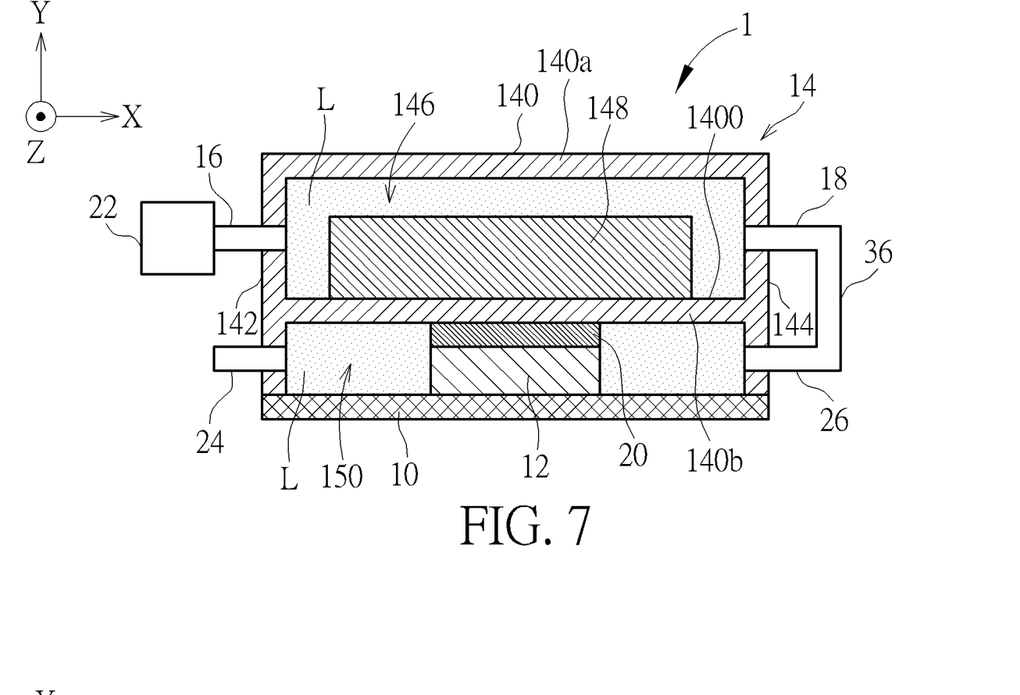
FIG. 7 is a cross-sectional view illustrating a package assembly according to another embodiment of the disclosure.

Referring to FIG. 7, FIG. 7 is a cross-sectional view illustrating a package assembly 1 according to another embodiment of the disclosure.

As shown in FIG. 7, the package assembly 1 may further comprise a connecting tube 36 connected to the second tube 18 and the fourth tube 26. Furthermore, the pump 22 may be connected to the first tube 16. The pump 22 may drive a cooling liquid L to flow into the heat dissipation space 146 through the first tube 16. Then, the cooling liquid L will flow out of the heat dissipation space 146 through the second tube 18 and flow into the chamber 150 through the connecting tube 36 and the fourth tube 26. Then, the cooling liquid L will flow out of the chamber 150 through the third tube 24. In an embodiment, the cooling liquid L may be dielectric liquid or the like.

Figure 8:
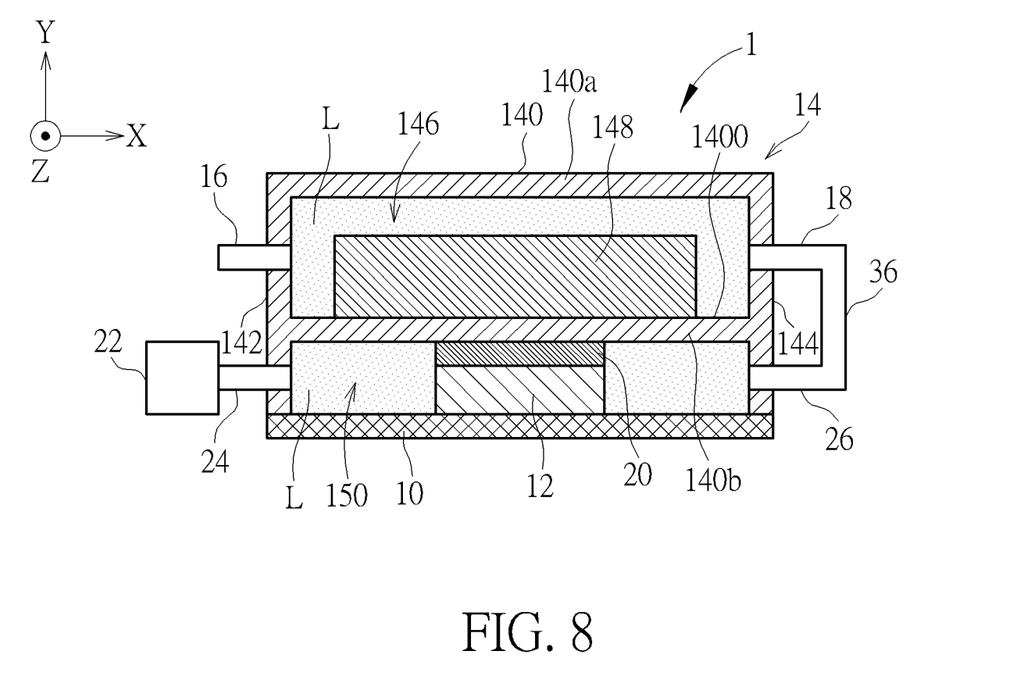
FIG. 8 is a cross-sectional view illustrating a package assembly according to another embodiment of the disclosure.

Referring to FIG. 8, FIG. 8 is a cross-sectional view illustrating a package assembly 1 according to another embodiment of the disclosure.

As shown in FIG. 8, the package assembly 1 may further comprise a connecting tube 36 connected to the second tube 18 and the fourth tube 26. Furthermore, the pump 22 may be connected to the third tube 24. The pump 22 may drive a cooling liquid L to flow into the chamber 150 through the third tube 24. Then, the cooling liquid L will flow out of the chamber 150 through the fourth tube 26 and flow into the heat dissipation space 146 through the connecting tube 36 and the second tube 18. Then, the cooling liquid L will flow out of the heat dissipation space 146 through the first tube 16. In an embodiment, the cooling liquid L may be dielectric liquid or the like.

The arrangement shown in FIG. 6 may be replaced by the arrangement shown in FIG. 7 or 8 to simplify the connection of the tubes.

Figure 9:
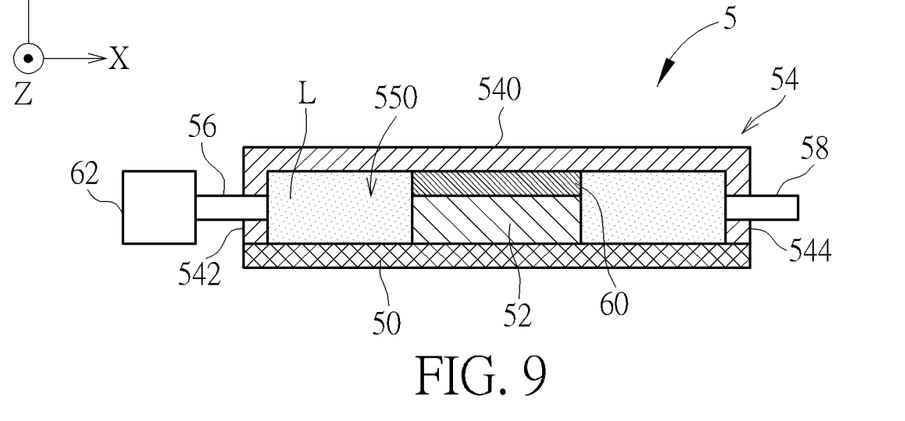
FIG. 9 is a cross-sectional view illustrating a package assembly according to another embodiment of the disclosure.

Referring to FIG. 9, FIG. 9 is a cross-sectional view illustrating a package assembly 5 according to another embodiment of the disclosure.

As shown in FIG. 9, the package assembly 5 comprises a substrate 50, an electronic component 52, a cover 54, a first tube 56, a second tube 58 and a first thermal interface material 60. In this embodiment, the substrate 50 maybe a printed circuit board (PCB) or the like, the electronic component 52 may be a die, chipset or the like, and the first thermal interface material 60 may be thermal paste or the like. In some embodiments, a portion of a top surface of the electronic component 52 maybe covered by the thermal interface material 60. For example, the TIM 60 illustrated in FIG. 9 covers total area of the top surface of the electronic component 52.

The electronic component 52 and the cover 54 are disposed on the substrate 50, wherein the electronic component 52 is located within the cover 54. In this embodiment, the cover 54 comprises a top portion 540, a first side portion 542 and a second side portion 544. The first side portion 542 and the second side portion 544 extend from opposite sides of the top portion 540 and are connected to the substrate 50. In an embodiment, the cover 54 may comprise a plurality of side portions surrounding the top portion 540, the plurality of side portions may be connected to the substrate 50 by a sealant, an adhesive or the like, and the first side portion 542 and the second side portion 544 may be two opposite side portions of the plurality of side portions. After the electronic component 52 and the cover 54 are disposed on the substrate 50, a chamber 550 is formed between the top portion 540, the first side portion 542, the second side portion 544 and the substrate 50, and the electronic component 52 is located within the chamber 550.

The first tube 56 is connected to the first side portion 542 and the second tube 58 is connected to the second side portion 544, wherein the first tube 56 and the second tube 58 both fluidly communicate with the chamber 550. Furthermore, the first thermal interface material 60 is disposed in the chamber 550 and sandwiched in between the electronic component 52 and the top portion 540.

In this embodiment, the package assembly 5 may further comprise a pump 62 connected to the first tube 56. The pump 62 may drive a cooling liquid L to flow into the chamber 550 through the first tube 56. When the electronic component 52 is operating, the heat generated by the electronic component 52 is directly transferred to the cooling liquid L in the chamber 550 and then the cooling liquid L flows out of the chamber 550 through the second tube 58. Furthermore, the heat generated by the electronic component 52 is also conducted to the top portion 540 through the first thermal interface material 60 and then dissipated by air. Accordingly, the heat generated by the electronic component 52 can be effectively dissipated by the cooling liquid L and air. In an embodiment, the cooling liquid L may be dielectric liquid or the like. In an embodiment, the second tube 58 maybe further connected to a radiator, a tank, and/or other liquid cooling components according to practical applications.

Figure 10:
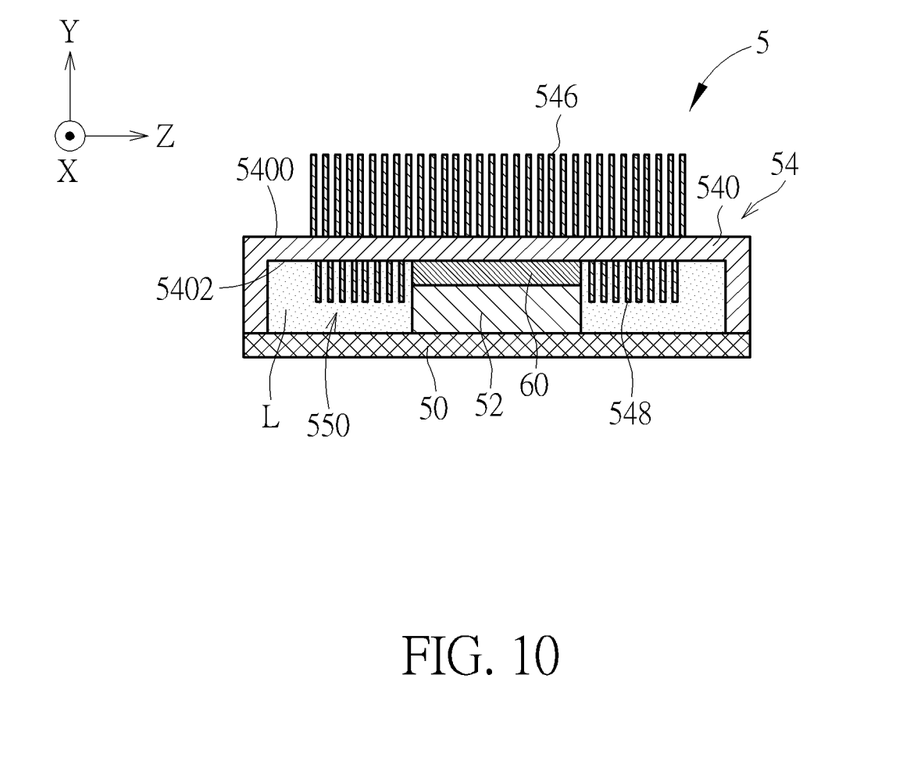
FIG. 10 is a cross-sectional view illustrating a package assembly according to another embodiment of the disclosure.

Referring to FIG. 10, FIG. 10 is a cross-sectional view illustrating a package assembly 5 according to another embodiment of the disclosure.

As shown in FIG. 10, the cover 54 may further comprise a plurality of fins 546 extending from an upper surface 5400 of the top portion 540 and spaced apart from each other. In the illustrated embodiment, the fins 546 are arranged in parallel to each other. Furthermore, the cover 54 may further comprise a plurality of fins 548 disposed in the chamber 550, extending from a lower surface 5402 of the top portion 540 facing the electronic component 52, and spaced apart from each other. In the illustrated embodiment, the fins 548 are arranged in parallel to each other. The fins 546 may be used for improving air cooling effect and the fins 548 may be used for improving liquid cooling effect.

Figure 11:
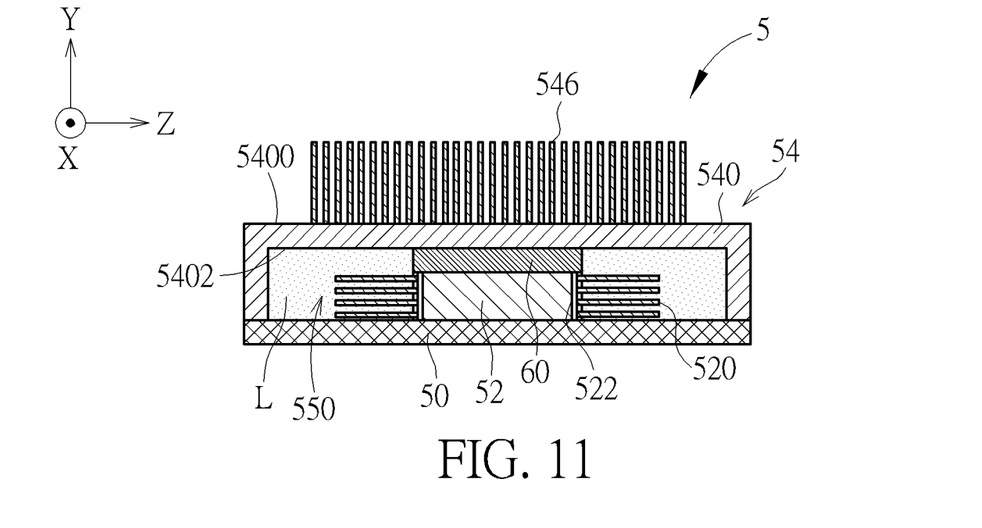
FIG. 11 is a cross-sectional view illustrating a package assembly according to another embodiment of the disclosure.

Referring to FIG. 11, FIG. 11 is a cross-sectional view illustrating a package assembly 5 according to another embodiment of the disclosure.

As shown in FIG. 11, the electronic component 52 may comprise a plurality of fins 520 extending from a periphery of the electronic component 52 and spaced apart from each other. In some embodiments, the electronic component 52 may be a die. In the illustrated embodiment, the fins 520 are arranged in parallel to each other, wherein a flowing direction of the cooling liquid L is parallel to a length direction of each fin 520 within the chamber 550. The fins 520 may extend from at least one side of the electronic component 52. For example, in this embodiment, the fins 520 may extend from opposite sides of the electronic component 52, but the disclosure is not so limited. In this embodiment, the electronic component 52 may further be formed with at least one via 522 and the plurality of fins 520 may extend from the at least one via 522. In an embodiment, the via 522 may be a through silicon via (TSV) or the like.

Figure 12:
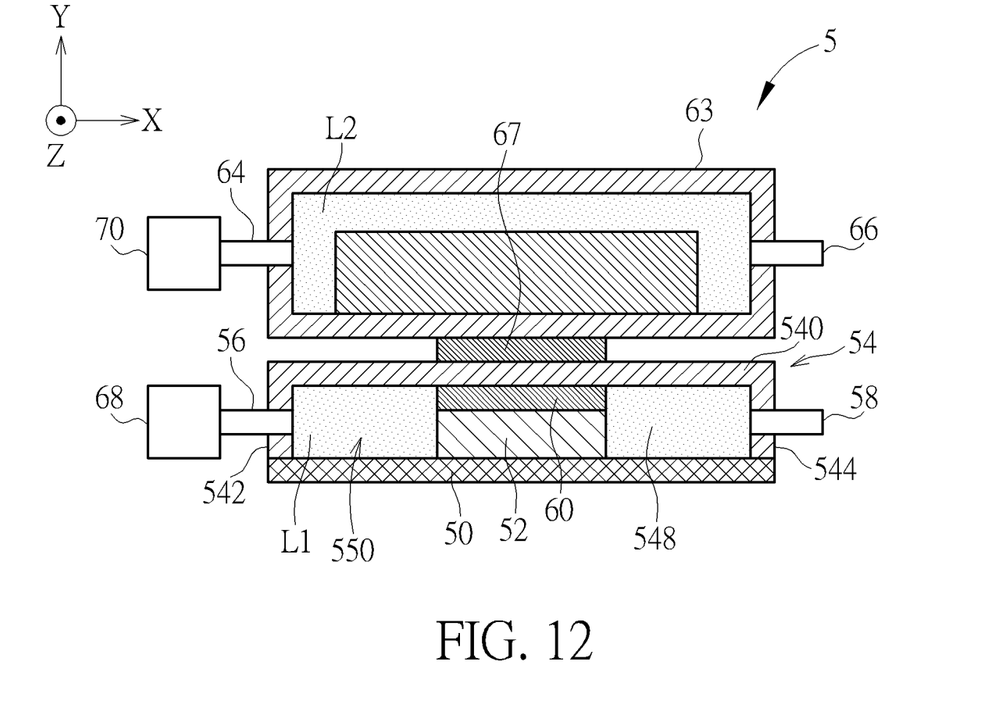
FIG. 12 is a cross-sectional view illustrating a package assembly according to another embodiment of the disclosure.

Referring to FIG. 12, FIG. 12 is a cross-sectional view illustrating a package assembly 5 according to another embodiment of the disclosure.

As shown in FIG. 12, the package assembly 5 may further comprise a heat dissipation device 63, a third tube 64, a fourth tube 66 and a second thermal interface material 67. The heat dissipation device 63 is disposed on the cover 54. The third tube 64 and the fourth tube 66 are connected to opposite sides of the heat dissipation device 63. The second thermal interface material 67 is sandwiched in between the heat dissipation device 63 and the top portion 540. In this embodiment, the heat dissipation device 63 may be a cold plate or the like, and the second thermal interface material 67 may be thermal paste or the like.

In this embodiment, the package assembly 5 may further comprise a first pump 68 and a second pump 70, wherein the first pump 68 may be connected to the first tube 56 and the second pump 70 may be connected to the third tube 64. The first pump 68 may drive a first cooling liquid L1 to flow into the chamber 550 through the first tube 56. When the electronic component 52 is operating, the heat generated by the electronic component 52 is directly transferred to the first cooling liquid L1 in the chamber 550 and then the first cooling liquid L1 flows out of the chamber 550 through the second tube 58. Furthermore, the second pump 70 may drive a second cooling liquid L2 to flow into the heat dissipation device 63 through the third tube 64. The heat generated by the electronic component 52 is also conducted to the heat dissipation device 63 through the first thermal interface material 60, the top portion 540 and the second thermal interface material 67. Then, the heat is transferred to the second cooling liquid L2 in the heat dissipation device 63 and then the second cooling liquid L2 flows out of the heat dissipation device 63 through the fourth tube 66. Accordingly, the heat generated by the electronic component 52 can be effectively dissipated by the first cooling liquid L1 and the second cooling liquid L2. In an embodiment, the first cooling liquid L1 may be dielectric liquid or the like, and the second cooling liquid L2 may be glycol, dielectric liquid, water, alcohol, a combination of water and alcohol, a combination of water and glycol, or other coolants. It should be noted that the first cooling liquid L1 and the second cooling liquid L2 maybe the same cooling liquid or different cooling liquids according to practical applications. In an embodiment, the second tube 58 and the fourth tube 66 may be further connected to a radiator, a tank, and/or other liquid cooling components according to practical applications.

In practical applications, the size of the chamber 550 is usually smaller than the size of the heat dissipation device 63, such that the fluid pressures in the chamber 550 and the heat dissipation device 63 are different. Therefore, the disclosure may use the first pump 68 and the second pump 70 to respectively drive the first cooling liquid L1 and the second cooling liquid L2 with different output powers, so as to satisfy the fluid pressures in the chamber 550 and the heat dissipation device 63. For example, the first pump 68 may drive the first cooling liquid L1 with a relative large output power while the second pump 70 may drive the second cooling liquid L2 with a relative small output power.

Figure 13:
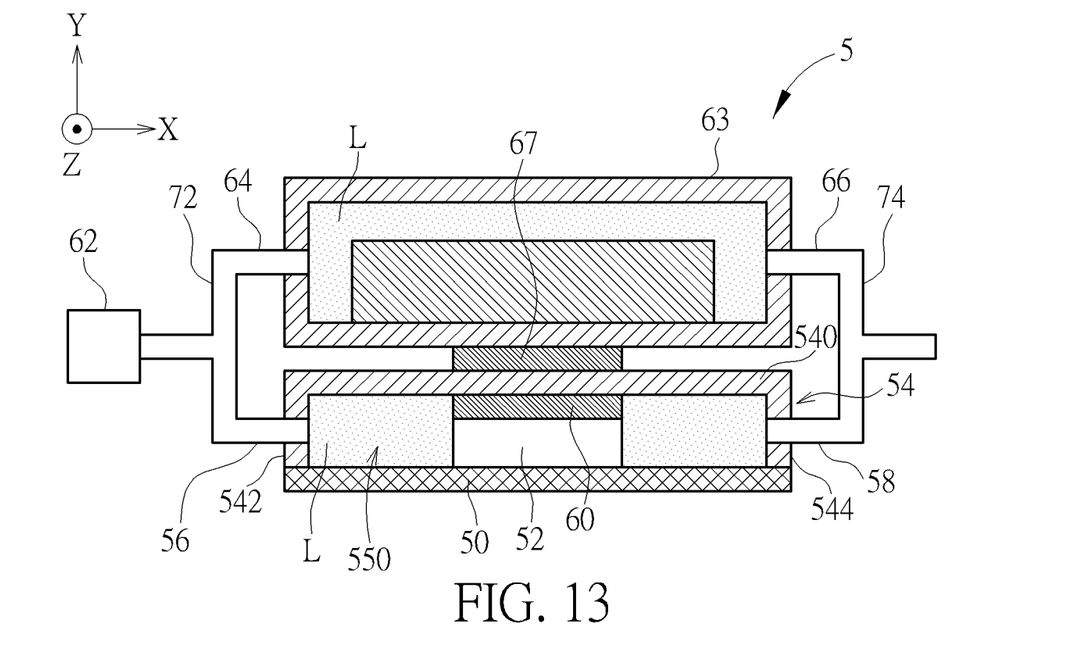
FIG. 13 is a cross-sectional view illustrating a package assembly according to another embodiment of the disclosure.

Referring to FIG. 13, FIG. 13 is a cross-sectional view illustrating a package assembly 5 according to another embodiment of the disclosure.

As shown in FIG. 13, the package assembly 5 may further comprise a first manifold 72 and a second manifold 74, wherein the first manifold 72 is connected to the first tube 56 and the third tube 64, and the second manifold 74 is connected to the second tube 58 and the fourth tube 66. Furthermore, the pump 62 may be connected to the first manifold 72. The pump 62 may drive a cooling liquid L to flow into the chamber 550 and the heat dissipation device 63 at the same time through the first manifold 72, the first tube 56 and the third tube 64. Then, the cooling liquid L will flow out of the chamber 550 and the heat dissipation device 63 through the second tube 58, the fourth tube 66 and the second manifold 74. Thus, the first pump 68 and the second pump 70 shown in FIG. 12 may be replaced by the pump 62 shown in FIG. 13 to reduce the manufacturing cost of the package assembly 5. In an embodiment, the cooling liquid L may be dielectric liquid or the like.

Figure 14:
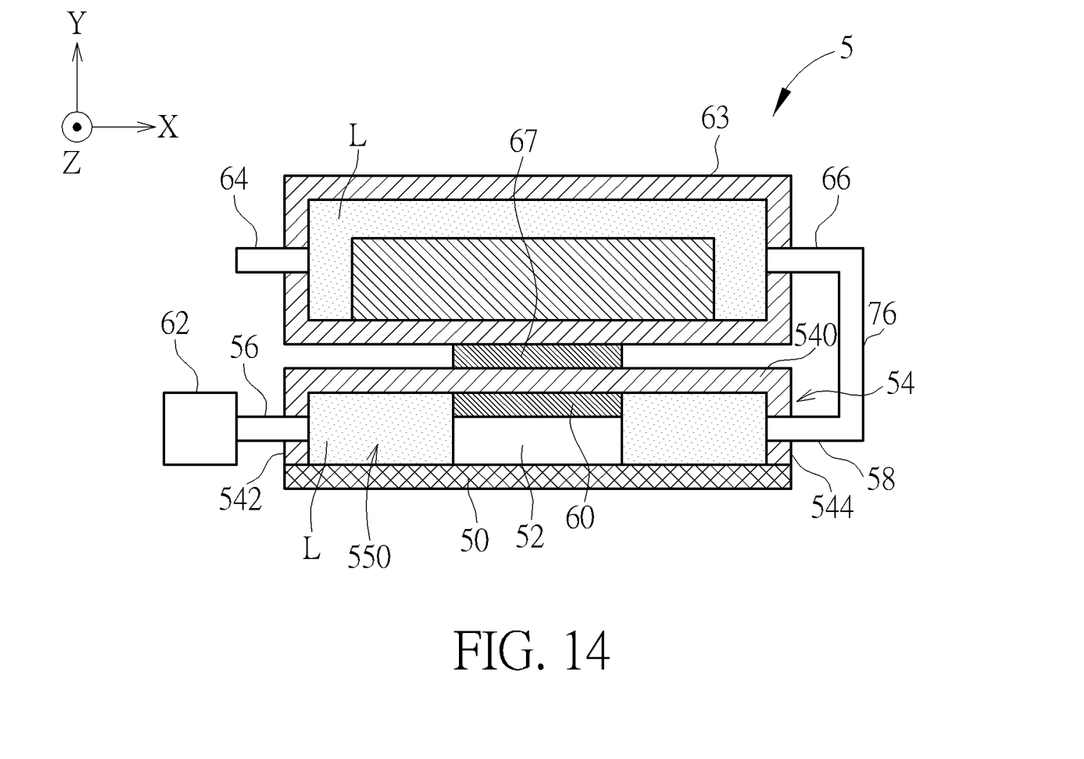
FIG. 14 is a cross-sectional view illustrating a package assembly according to another embodiment of the disclosure.

Referring to FIG. 14, FIG. 14 is a cross-sectional view illustrating a package assembly 5 according to another embodiment of the disclosure.

As shown in FIG. 14, the package assembly 5 may further comprise a connecting tube 76 connected to the second tube 58 and the fourth tube 66. Furthermore, the pump 62 may be connected to the first tube 56. The pump 62 may drive a cooling liquid L to flow into the chamber 550 through the first tube 56. Then, the cooling liquid L will flow out of the chamber 550 through the second tube 58 and flow into the heat dissipation device 63 through the connecting tube 76 and the fourth tube 66. Then, the cooling liquid L will flow out of the heat dissipation device 63 through the third tube 64. In an embodiment, the cooling liquid L may be dielectric liquid or the like Referring to FIG. 15, FIG. 15 is a cross-sectional view illustrating a package assembly 5 according to another embodiment of the disclosure.

Figure 15:
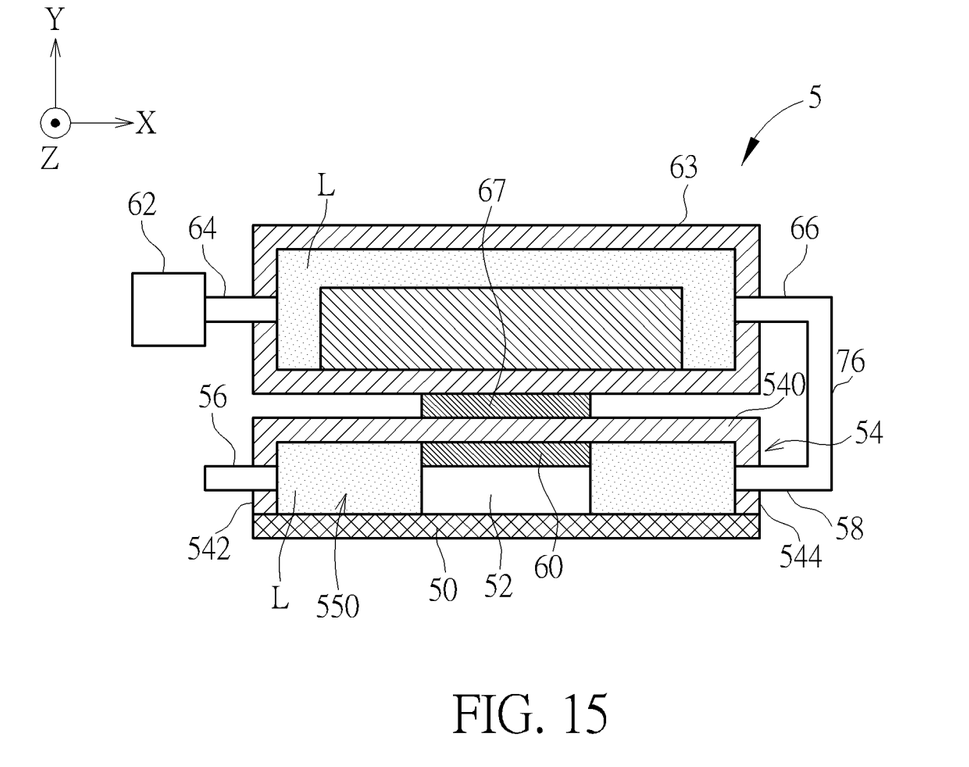
FIG. 15 is a cross-sectional view illustrating a package assembly according to another embodiment of the disclosure.

As shown in FIG. 15, the package assembly 5 may further comprise a connecting tube 76 connected to the second tube 58 and the fourth tube 66. Furthermore, the pump 62 may be connected to the third tube 64. The pump 62 may drive a cooling liquid L to flow into the heat dissipation device 63 through the third tube 64. Then, the cooling liquid L will flow out of the heat dissipation device 63 through the fourth tube 66 and flow into the chamber 550 through the connecting tube 76 and the second tube 58. Then, the cooling liquid L will flow out of the chamber 550 through the first tube 56. In an embodiment, the cooling liquid L may be dielectric liquid or the like The arrangement shown in FIG. 13 may be replaced by the arrangement shown in FIG. 14 or 15 to simplify the connection of the tubes.

As mentioned in the above, the disclosure may dispose the cover with the heat dissipation space on the substrate and fill the cooling liquid in the heat dissipation space, so as to dissipate the heat generated by the electronic component. Furthermore, the disclosure may fill the cooling liquid in the chamber where the electronic component is located, so as to directly dissipate the heat generated by the electronic component. In an embodiment, the disclosure may fill the cooling liquid in the heat dissipation space of the cover and fill the cooling liquid in the chamber where the electronic component is located at the same time, so as to further improve heat dissipation efficiency. In another embodiment, the disclosure may further dispose the heat dissipation device on the cover, so as to further improve heat dissipation efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package assembly comprising:
   a substrate;
   an electronic component disposed on the substrate;
   a cover disposed on the substrate, the cover comprising a top portion, a first side portion, a second side portion and a heat dissipation space, the first side portion and the second side portion extending from opposite sides of the top portion and being connected to the substrate, the heat dissipation space being formed within the top portion, the first side portion and the second side portion, a chamber being formed between the top portion, the first side portion, the second side portion and the substrate, the electronic component being located within the chamber;
   a first tube connected to the first side portion and communicating with the heat dissipation space;
   a second tube connected to the second side portion and communicating with the heat dissipation space;
   a third tube connected to the first side portion and communicating with the chamber;
   a fourth tube connected to the second side portion and communicating with the chamber;
   a first manifold connected to the first tube and the third tube;
   a second manifold connected to the second tube and the fourth tube; and
   a pump connected to the first manifold, the pump driving a cooling liquid to flow into the heat dissipation space and the chamber through the first manifold, the first tube and the third tube, the cooling liquid flowing out of the heat dissipation space and the chamber through the second tube, the fourth tube and the second manifold.

2. The package assembly of claim 1, further comprising a thermal interface material disposed in the chamber and sandwiched in between the electronic component and the top portion.

3. The package assembly of claim 1, wherein the cover further comprises a plurality of fins disposed in the heat dissipation space, extending from an inner surface of the top portion, and spaced apart from each other.

4. The package assembly of claim 1, wherein the cover further comprises a plurality of fins disposed in the chamber, extending from a lower surface of the top portion facing the electronic component, and spaced apart from each other.

5. The package assembly of claim 1, wherein the electronic component comprises a plurality of fins extending from a periphery of the electronic component and spaced apart from each other.

6. The package assembly of claim 5, wherein the electronic component is further formed with at least one via and the plurality of fins extend from the at least one via.

7. A package assembly comprising:
   a substrate;
   an electronic component disposed on the substrate;
   a cover disposed on the substrate, the cover comprising a top portion, a first side portion and a second side portion, the first side portion and the second side portion extending from opposite sides of the top portion and being connected to the substrate, a chamber being formed between the top portion, the first side portion, the second side portion and the substrate, the electronic component being located within the chamber;
   a first tube connected to the first side portion and communicating with the chamber;
   a second tube connected to the second side portion and communicating with the chamber;
   a first thermal interface material disposed in the chamber and sandwiched in between the electronic component and the top portion;
   a heat dissipation device disposed on the cover;
   a third tube;
   a fourth tube, the third tube and the fourth tube being connected to opposite sides of the heat dissipation device;

a first manifold connected to the first tube and the third tube;

a second manifold connected to the second tube and the fourth tube; and a pump connected to the first manifold, the pump driving a cooling liquid to flow into the chamber and the heat dissipation device through the first manifold, the first tube and the third tube, the cooling liquid flowing out of the chamber and the heat dissipation device through the second tube, the fourth tube and the second manifold.

8. The package assembly of claim 7, further comprising a second thermal interface material sandwiched in between the heat dissipation device and the top portion.

9. The package assembly of claim 7, wherein the cover further comprises a plurality of fins extending from an upper surface of the top portion and spaced apart from each other.

10. The package assembly of claim 7, wherein the cover further comprises a plurality of fins disposed in the chamber, extending from a lower surface of the top portion facing the electronic component, and spaced apart from each other.

11. The package assembly of claim 7, wherein the electronic component comprises a plurality of fins extending from a periphery of the electronic component and spaced apart from each other.

12. The package assembly of claim 11, wherein the electronic component is further formed with at least one via and the plurality of fins extend from the at least one via.

* * * * *